(12) United States Patent
Nadarajan et al.

(10) Patent No.: US 10,509,078 B2
(45) Date of Patent: Dec. 17, 2019

(54) ASSESSMENT METHOD

(71) Applicant: ROLLS-ROYCE PLC, London (GB)

(72) Inventors: Sivakumar Nadarajan, Singapore (SG); Shantha Dharmasiri Gamini Jayasinghe, Singapore (SG); Amit Kumar Gupta, Singapore (SG); Chandana Jayampathi Gajanayake, Singapore (SG); Viswanathan Vaiyapuri, Singapore (SG)

(73) Assignee: ROLLS-ROYCE PLC, London (GB)

( * ) Notice: Subject to any disclaimer, the term of this patent is extended or adjusted under 35 U.S.C. 154(b) by 325 days.

(21) Appl. No.: 14/926,853

(22) Filed: Oct. 29, 2015

(65) Prior Publication Data

US 2016/0154065 A1    Jun. 2, 2016

(30) Foreign Application Priority Data

Nov. 28, 2014 (GB) .................................. 1421135.3

(51) Int. Cl.
    *G01R 31/40*           (2014.01)

(52) U.S. Cl.
    CPC .................................. *G01R 31/40* (2013.01)

(58) Field of Classification Search
    CPC .............................. G11R 31/40; G11R 29/16
    USPC ........................................................ 702/58
    See application file for complete search history.

(56) References Cited

U.S. PATENT DOCUMENTS

| | | | |
|---|---|---|---|
| 3,909,687 A | 9/1975 | Abbondanti | |
| 4,100,587 A | 7/1978 | Anderson et al. | |
| 4,423,374 A * | 12/1983 | Hansen, Jr. | ............ G01R 29/16 |
| | | | 324/140 R |
| 4,442,393 A | 4/1984 | Abbondanti | |
| 4,600,874 A | 7/1986 | Tupper et al. | |
| 4,858,057 A | 8/1989 | Maier et al. | |
| 4,862,054 A | 8/1989 | Schauder | |
| 6,144,924 A * | 11/2000 | Dowling | .............. G01R 31/343 |
| | | | 702/60 |

(Continued)

FOREIGN PATENT DOCUMENTS

| | | |
|---|---|---|
| CN | 103744023 A | 4/2014 |
| DE | 25 39 451 A1 | 3/1977 |

(Continued)

OTHER PUBLICATIONS

May 2, 2016 Search Report issued in European Patent Application No. 15 19 2070.

(Continued)

*Primary Examiner* — Huan Hoang
*Assistant Examiner* — Muna A Techane
(74) *Attorney, Agent, or Firm* — Oliff PLC

(57) ABSTRACT

A method of assessing a condition of a multi-phase power system comprises the steps of: acquiring a voltage signal and a current signal for each phase of the multi-phase power system; calculating a product of the voltage signal for each phase of the multi-phase power system with one of the current signals such that the product is between a voltage signal for one phase and a current signal for a different phase for at least two of the products; summing the calculated products; and identifying the possible existence of a fault in the multi-phase power system based on a frequency analysis of the summed calculated products.

24 Claims, 6 Drawing Sheets

(56) References Cited

U.S. PATENT DOCUMENTS

| | | | | |
|---|---|---|---|---|
| 6,636,823 B1* | 10/2003 | Unsworth | ............ | G01R 31/343 |
| | | | | 324/76.24 |
| 6,640,196 B1* | 10/2003 | Unsworth | ............ | G01R 31/343 |
| | | | | 702/115 |
| 6,792,360 B2* | 9/2004 | Smulders | ............... | G01H 1/003 |
| | | | | 702/35 |
| 6,832,175 B2* | 12/2004 | Adachi | ..................... | E02F 9/20 |
| | | | | 37/348 |
| 7,034,706 B1* | 4/2006 | Nippes | ................. | G01R 31/343 |
| | | | | 340/635 |
| 7,949,495 B2* | 5/2011 | Wiklund | ................. | G01F 1/363 |
| | | | | 702/183 |

FOREIGN PATENT DOCUMENTS

| | | |
|---|---|---|
| EP | 0 255 659 A1 | 2/1988 |
| EP | 2 565 658 A1 | 3/2013 |
| FR | 2959618 * | 11/2011 |
| GB | 2 196 747 A | 5/1988 |

OTHER PUBLICATIONS

May 18, 2015 Search Report issued in British Patent Application No. 1421135.3.

* cited by examiner

ASSESSMENT METHOD

This disclosure claims the benefit of UK Patent Application No. GB1421135.3, filed on 28 Nov. 2014, which is hereby incorporated herein in its entirety.

The present disclosure relates to a method and system for assessing the condition of a multi-phase power system, for example, for assessing the condition of electrical equipment in a multi-phase power system.

A multi-phase power system refers to an electrical system which draws electrical power from multiple electrical conductors carrying alternating currents with a fixed phase difference between the voltage signals in each conductor. An example of a multi-phase power system is a three-phase power system in which each voltage signal is out of phase by 120 degrees from the other two voltage signals. Electrical equipment in a multi-phase power system might include a motor, generator or a transformer. Multi-phase power is particularly useful for providing power to electrical equipment such as an induction machine.

Electrical and mechanical stresses are the primary cause of faults in a multi-phase power system. If these faults are undetected they may lead to electrical or mechanical failure of the system, causing permanent damage and significant maintenance expense. For example, in the context of an induction motor, one of the most common electrical faults is in the stator winding. A short circuit in the stator winding degrades performance of the motor. However, no matter what the fault, it is desirable to diagnose a fault as early as possible, for example, so that the necessary intervention can occur to prevent the fault developing further, or to replace the system. Therefore, it is desirable to regularly monitor the condition of a multi-phase power system.

One indicator of the condition of a multi-phase power system is the unbalance of the system. Multi-phase power is typically provided in a balanced way such that each different phase has the same voltage amplitude, current amplitude and the relative phase angles between the voltages of different phases is the same. An unbalance in the multi-phase power system is a situation where at least one of the phases differs from the other two in voltage amplitude, current amplitude, or the relative phase angles between the voltages of different phases differs. Although in reality no multi-phase power system is ideal, an unbalance greater than a certain threshold may indicate that there are faults in the system. Further, a particular type of unbalance (e.g. unbalance in voltage or current) may indicate a particular type of fault.

Conventional systems and methods for assessing the condition of multi-phase power systems generally require intensive computation and large memory. Further, conventional methods may be incapable of diagnosing incipient faults, with minor effects on system characteristics, and may give unreliable diagnosis under certain conditions.

According to an aspect there is provided a method of assessing a condition of a multi-phase power system, the method comprising: acquiring a voltage signal and a current signal for each phase of the multi-phase power system; calculating a product of the voltage signal for each phase of the multi-phase power system with one of the current signals such that the product is between a voltage signal for one phase and a current signal for a different phase for at least two of the products; summing the calculated products; identifying the possible existence of a fault in the multi-phase power system based on a frequency analysis of the summed calculated products.

Optionally, the frequency analysis may include obtaining a direct current component of the summed calculated products. Optionally, the frequency analysis may include obtaining a second harmonic component of the summed calculated products. Optionally, it is identified that there is a possible fault in the multi-phase power system, if at least one component exceeds a threshold.

Optionally, a reactive component of the summed calculated products is calculated by summing products of the voltage signals and current signals in which the phase difference between each pair of signals in the product is different from the phase difference between the signals in the originally acquired voltage and current signals by 90 degrees. Optionally, an active component of the summed calculated products is calculated by summing products of the voltage signals and current signals in which the phase difference between each pair of signals in the product is the same as the phase difference between the signals in the originally acquired voltage and current signals.

Optionally, the frequency analysis is performed on both the active and reactive components of the summed calculated products. Optionally, in identifying the possible existence of a fault in the multi-phase power system the sign and magnitude of the frequency analysed active component of the summed calculated products and the frequency analysed reactive component of the summed calculated products are analysed.

Optionally, the step of calculating the summed calculated products may comprise: obtaining a voltage vector by combining the voltage signals for each of the phases of the multi-phase power system in order; obtaining a current vector by combining the current signals for each of the phases of the multi-phase power system but in a different order to the voltage vector such that the positions of current signals in the current vector for at least two phases are different from the positions of the voltage signals in the voltage vector for the same two phases; linearly transforming the voltage and current vectors having a component for each phase of the multi-phase system to reduced voltage and current vectors having fewer components; calculating the product of the reduced voltage and current vectors. Optionally, the step of linearly transforming the voltage and current vectors uses a Park transformation.

Optionally, the method may comprise: calculating a second product of the voltage signal for each phase of the multi-phase power system with one of the current signals such that the product is between a voltage signal for one phase and a current signal for a different phase for at least a second two of the products, where the second two products are different to the previous two products; summing the calculated second products; and identifying the possible existence of a fault in the multi-phase power system based on a frequency analysis of the summed calculated products and the summed calculated second products.

Optionally, the method may comprise physically inspecting the multi-phase power system when a certain condition is determined.

According to a second aspect, there is provided a system for assessing a condition of a multi-phase power system, the system comprising: a voltage and current acquiring unit configured to acquire a voltage signal and a current signal for each phase of the multi-phase power system; a first processing unit configured to calculated a product of the voltage signal for each phase of the multi-phase power system with one of the current signals such that the product is between a voltage signal for one phase and a current signal for a different phase for at least two of the products, and sum the calculated products; a second processing unit configured to perform a frequency analysis on the summed calculated products; a third processing unit configured to identify the possible existence of a fault in the multi-phase power system based on the frequency analysis of the summed calculated products.

Optionally, the second processing unit may be configured to extract the direct current component of the summed calculated products. Optionally, the second processing unit may be a low-pass filter. Optionally, the second processing unit may be configured to extract the second harmonic component of the summed calculated products. Optionally, the third processing unit may be configured to identify that there is a possible fault in the multi-phase power system if at least one component exceeds threshold.

Optionally, the first processing unit may be configured to calculate a reactive component of the summed calculated products by summing products of the voltage signals and current signals in which the phase difference between each pair of signals in the product is different from the phase difference between the signals in the originally acquired voltage and current signals by 90 degrees. Optionally, the first processing unit may be configured to calculate an active component of the summed calculated products by summing products of the voltage signals and current signals in which the phase difference between each pair of signals in the product is the same as the phase difference between the signals in the originally acquired voltage and current signals.

Optionally, the second processing unit may be configured to perform a frequency analysis on the active component and reactive component of the summed calculated products; and the third processing unit may configured to identify the possible existence of a fault in the multi-phase power system based on the frequency analysis of the active component and reactive component of the summed calculated products.

Optionally, the third processing unit may be configured to analyse the sign and magnitude of the frequency analysed active component of the summed calculated products and the sign and magnitude of the frequency analysed reactive component of the summed calculated products to identify the possible existence of a fault in the multi-phase power system.

Optionally, the first processing unit may be configured to: obtain a voltage vector by combining the voltage signals for each of the phases of the multi-phase power system in order; obtain a current vector by combining the current signals for each of the phases of the multi-phase power system but in a different order to the voltage vector such that the positions of current signals in the current vector for at least two phases are different from the positions of the voltage signals in the voltage vector for the same two phases; linearly transform the voltage and current vectors having a component for each phase of the multi-phase system to reduced voltage and current vectors having fewer components; and calculate the product of the reduced voltage and current vectors.

Optionally, the first processing unit may be further configured to calculate a second product of the voltage signal for each phase of the multi-phase power system with one of the current signals such that the product is between a voltage signal for one phase and a current signal for a different phase for at least a second two of the products, where the second two products are different to the previous two products, and sum the calculated second products; and the second processing unit may be further configure to identify the possible existence of a fault in the multi-phase power system based on a frequency analysis of the summed calculated products and the summed calculated second products.

Embodiments of the disclosure will now be described by way of non-limitative examples with reference to the accompanying drawings in which.

Figure 1:
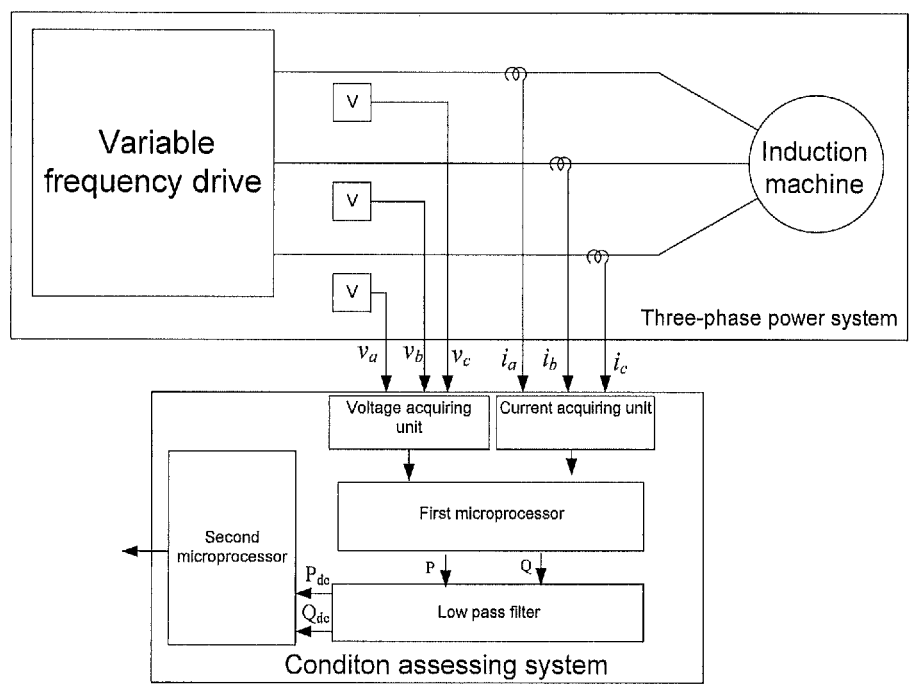
FIG. 1 shows a block diagram of a system for assessing the condition of a three-phase power system.

The present disclosure provides a method and system for assessing the condition of a multi-phase power system. The power system generally comprises a power source and a load. The power system may have any number of phases, although the specific examples described have three phases. The type of load is not limited, but may include, for example, one of an induction machine, a synchronous machine, a permanent magnet synchronous machine and a transformer.

Voltage and current signals are acquired for each phase of a multi-phase power system by, for example, voltage sensors and currents sensors. The voltage and current sensors may be connected to terminals between the power source of the load and the multi-phase system.

Signals acquired directly by the voltage and current sensors may be adjusted. For example, the signal amplitude for one or more of the signals may be normalised.

Analogue signals acquired by the voltage and current sensors may be converted into digital signals by an analogue-to-digital (A/D) converter. Standard signal processing for improving the quality of the digitally converted signals may be used, for example, anti-aliasing filters may be used prior to A/D conversion.

The current and voltage signals are input into a first processing unit. This may be a microprocessor loaded with specific software for performing calculations using the current and voltage signals. Alternatively, the first processing unit may be a computer or a specifically configured hardware system. The first processing unit may include a memory, for example a RAM, to store the current and voltage signals while performing the calculations.

In a multi-phase power system, the power for each phase is the product of the current and voltage for each phase. The power of the system is the sum of the individual powers for each phase.

Taking a three-phase power system as an illustrative example, if the three phases are labelled A, B and C, their respective voltages $V_a$, $V_b$, $V_c$ and their respective currents $I_a$, $I_b$, $I_c$, then the power is $V_aI_a+V_bI_b+V_cI_c$. Summed products of the voltage and current signals in which the phase difference between each pair of signals in the product is the same as the phase difference between the signals in the multi-phase power system (e.g. originally acquired voltage and current signals), gives the active power. Summed products of the voltage and current signals in which the phase difference between each pair of signals in the product is different from the phase difference between the signals in the multi-phase power system (e.g. originally acquired voltage and current signals) by 90 degrees gives the reactive power.

When the three-phase power system is balanced, the expression for active power is:

$$P_{ABC\_balanced}=3/2V_mI_m\cos(\varphi) \quad (1)$$

where, $V_m$ is the peak value of phase voltage, $I_m$ is the peak value of phase current, and $\varphi$ is the relative phase angle between the phase voltage and the phase current.

When the three-phase power system is unbalanced then the derived expression for the active power is $$P_{ABC\_unbalanced} = \frac{V_m I_m}{200} \quad (2)$$
$$(((300 - (\% \text{ unbalance})) * \cos(\varphi)) + (\% \text{ unbalance}) * \cos(\varphi - 2 \omega t))$$

where $V_m$ is the peak value of phase voltage, $I_m$ is the peak value of phase current, $\omega$ is the frequency of the phase voltage and the phase current in rad/sec and $\varphi$ is the phase angle between the phase voltage and the phase current.

The variable % unbalance in Equation 2 represents the degree of unbalance (i.e. percentage of sag in voltage or current magnitude) in any one of the three phases with respect to the other two phases. For example if the respective peak values of the phase voltages are $V_{a\_peak}=95V$, $V_{b\_peak}=100V$, $V_{c\_peak}=100V$ then the % unbalance will take the value 5 (i.e. ((100-95)/100)%).

The expression in Equation 2 has two distinct components. The first component is an alternating current (AC) component with frequency of $2\omega$. The second component is a DC component with a magnitude $$\frac{V_m I_m}{200} * (300 - (\% \text{ unbalance}))\cos(\varphi).$$

The magnitude of the DC component is a function of the unbalance in the currents or voltages of the three phases. Both the active power in Equation 1 for the balanced case, and the active power in Equation 2 for the unbalanced case, have a DC component. Therefore, the active power calculated does not clearly differentiate the balanced condition from unbalanced conditions.

According to the present disclosure, the first processing unit calculates a product of the voltage signal for each phase of the multi-phase power system with one of the current signals such that the product is between a voltage signal for one phase and a current signal for a different phase for at least two of the products. The first processing unit then sums the calculated products. The sum of the calculated products is output to a second processing unit. Hereinafter, the summed calculated products will generally be referred to as a combined-sequence power.

Again, taking a three-phase power system as an illustrative example, if the three phases are labelled A, B and C, their respective voltages $V_a$, $V_b$, $V_c$ and their respective currents $I_A$, $I_B$, $I_C$ then the combined sequence power may be $V_a I_b + V_b I_a + V_c I_c$, for example. Under balanced voltage and current conditions, the calculated combined-sequence active power $P_{BAC}$ is:

$$P_{BAC\_balanced} = \frac{3V_m I_m}{4}\left([\cos(\varphi - 2 \omega t) + \sqrt{3} \sin(\varphi - 2 \omega t)]\right) \quad (3)$$

The combined-sequence reactive power $Q_{BAC}$ calculated for the balanced condition is:

$$Q_{BAC\_balanced} = \frac{3V_m I_m}{4}\left([\cos(\varphi - 2 \omega t) - \sqrt{3} \sin(\varphi - 2 \omega t)]\right) \quad (4)$$

where $V_m$ is the peak value of phase voltage, $I_m$ is the peak value of phase current, $\omega$ is the frequency of the phase voltage and the phase current in rad/sec and $\varphi$ is the phase angle between the phase voltage and the phase current.

The corresponding combined-sequence active and reactive powers for an unbalance in the phase A voltage are:

$$P_{BAC\_unbalance} = \frac{V_m I_m}{400} \quad (5)$$
$$\left(\begin{array}{c}(300 - (\% \text{ unbalanced}))[\cos(\varphi - 2 \omega t) + \sqrt{3} \sin(\varphi - 2 \omega t)] + \\ [(\% \text{ unbalance})(\cos(\varphi) + \sqrt{3} \sin(\varphi))]\end{array}\right)$$

$$Q_{BAC\_unbalance} = \frac{V_m I_m}{400} \quad (6)$$
$$\left(\begin{array}{c}(300 - (\% \text{ unbalanced}))[3 \cos(\varphi - 2 \omega t) + \sqrt{3} \sin(\varphi - 2 \omega t)] + \\ [(\% \text{ unbalance})(3 \cos(\varphi) - \sqrt{3} \sin(\varphi))]\end{array}\right)$$

where $V_m$ is the peak value of phase voltage, $I_m$ is the peak value of phase current, $\varphi$ is the phase angle between the phase voltage and the phase current, $\omega$ is the frequency of the phase voltage and the phase current in rad/sec, and % unbalance is the percentage reduction in phase A voltage with respect to other two phase voltages.

Similarly, the corresponding combined-sequence active and reactive powers for an unbalance in the phase A current are:

$$P_{BAC\_unbalance} = \frac{V_m I_m}{400} \quad (7)$$
$$\left(\begin{array}{c}(300 - (\% \text{ unbalanced}))[\cos(\varphi - 2 \omega t) + \sqrt{3} \sin(\varphi - 2 \omega t)] + \\ [(\% \text{ unbalance})(\cos(\varphi) + \sqrt{3} \sin(\varphi))]\end{array}\right)$$

$$Q_{BAC\_unbalance} = \frac{V_m I_m}{400} \quad (8)$$
$$\left(\begin{array}{c}(300 - (\% \text{ unbalanced}))[3\cos(\varphi - 2 \omega t) + \sqrt{3} \sin(\varphi - 2 \omega t)] + \\ [(\% \text{ unbalance})(3 \cos(\varphi) - \sqrt{3} \sin(\varphi))]\end{array}\right)$$

In contrast to conventional power, the combined-sequence active and reactive powers have no DC component in the balanced condition, but have a DC component in the unbalanced condition. Therefore, the presence of a DC component in the combined-sequence active power or the combined-sequence reactive power indicates an unbalance in the power system. This, in turn, may indicate the possible existence of a fault.

The above described calculations of combined sequence power, by the first processing unit, may be performed by calculating a scalar of product of two vectors, where one vector is a voltage vector formed having components corresponding to the voltage signals for each phase and the other vector is a current vector formed having components corresponding to the current signals for each phase. The voltage signals are arranged in the voltage vector in a first order, for example in order of their relative phases (e.g. ABC for three phases). The current signals are arranged in the current vector in a different order to the voltage signals in the voltage vector such that the positions of current signals in the current vector for at least two phases are different from the positions of the voltage signals in the voltage vector for the same two phases (e.g. BAC/ACB/CBA for three phases). The current and voltage vectors can be formed for example by first forming two vectors in which the order of the voltage signals and current signals are the same (e.g. ABC and ABC for three phases) and then swapping two or more of the voltage or current signals (e.g. ABC changed to BAC/ACB/CBA by swapping two signals for a three-phase power system).

The above described vectors may be represented in a different way, for example, vectors with N components for N phases can be represented by vectors with N−1 components by performing a linear transformation such as a Park transformation. The Park transformation may be used for a three-phase system to represent a vector with three components by a vector with two components.

The first processing unit may repeat the calculation steps described above but for different products of current and voltage signals. For example, a second product of the voltage signal for each phase of the multi-phase power system with one of the current signals may be calculated such that the product is between a voltage signal for one phase and a current signal for a different phase for at least a second two of the products, where the second two products are different to the two products for a previous calculation. Calculations may be performed for each combination of voltage signal and current signal that satisfy the criteria that the product is between a voltage signal for one phase and a current signal for a different phase for at least two of the products. This will provide multiple combined-sequence powers to the second processing unit. Calculations for different products of current and voltage signals, as described above may be performed in series (at separate times) or in parallel (at the same time).

The first processing unit may calculate a combined-sequence active power by calculating a product of the voltage signal for each phase of the multi-phase power system with one of the current signals such that the product is between a voltage signal for one phase and a current signal for a different phase for at least two of the products, wherein the phase difference between each pair of signals in the product is the same as the phase difference between the signals in the originally acquired voltage and current signals. The first processing unit then sums the calculated products. The combined-sequence active power may be calculated based on the current and voltage signals acquired directly from the multi-phase power system.

The first processing unit may calculate a combined-sequence reactive power by calculating a product of the voltage signal for each phase of the multi-phase power system with one of the current signals such that the product is between a voltage signal for one phase and a current signal for a different phase for at least two of the products, wherein the phase difference between each pair of signals in the product is different from the phase difference between the signals in the originally acquired voltage and current signals by 90 degrees. The combined-sequence reactive power may be calculated based on the current (or voltage) signals acquired directly from the multi-phase power system and the voltage (or current) signals acquired by shifting the signals acquired directly from the multi-phase power system by 90 degrees. The first processing unit may include means for shifting the phase of the voltage or current signals.

The second processing unit analyses the frequency of the signal output by the first processing unit, namely the combined-sequence power. The frequency analysis may include the extraction of a DC component of the combined-sequence power (e.g. the combined-sequence active power). Extraction of a DC component can be performed by a low-pass filter, in which case the second processing unit may include a low-pass filter.

The frequency analysis may alternatively or additionally include the extraction of second harmonic component of the combined-sequence power. This can be performed for example using a band-pass filter, in which case the second processing unit may include a band-pass filter. Alternatively, the DC and/or second harmonic components of the combined-sequence power can be extracted using a frequency spectrum analyser to compute a Fourier transform of the combined-sequence power. The second processing unit may alternatively be a computer or specifically configured hardware system. The result of the frequency analysis is output to a third processing unit.

The frequency analysis may be a frequency signature analysis used to extract a characteristic frequency (or frequencies) from the combined-sequence power.

The third processing unit identifies the possible existence of a fault in the multi-phase power system based on the frequency analysis of the combined-sequence power by the second processing unit. The third processing unit may be a microprocessor loaded with software specific to its function. Alternatively, the third processing unit may be a computer or a specifically configured hardware system.

As previously described, a DC component and/or second harmonic component in the combined-sequence power indicates that the multi-phase power system is unbalanced, which in turn indicates the possible existence of a fault. However, even a healthy system may not be perfectly balanced so the combined-sequence power of a healthy system may have a small DC and/or second harmonic component.

The third processing unit may compare the magnitude of the DC and/or second harmonic component of the combined-sequence power to a predetermined threshold. If the magnitude is greater than the predetermined threshold, the third processing unit identifies the possible existence of a fault. The precise magnitude of the component of the combined-sequence power may indicate the perceived severity of the fault. The threshold values may depend on the operating parameters of the system, for example, peak voltage and peak current, relative phase between voltage and current and the frequency of the voltage and current. Therefore, the third processing unit may be set to use threshold values from a database that correspond to the operating parameters of the system or be configured to calculate the threshold values based on the operating parameters of the system.

The unbalance in the multi-phase power system may be in the current or voltage of any of the three phases. Further analysis of the DC components of the combined-sequence active power and the combined-sequence reactive power may provide more information about a possible fault e.g. whether unbalance is in current or voltage and in which phase.

Again, taking a three-phase power system as an illustrative example, Tables 1 and 2 show expressions for the DC components of the combined-sequence active and reactive powers for unbalance in voltage and current for the different phases. In the tables, the phases are labelled such that the phases A, B and C are successively out of phase by 120 degrees. Table 1 is for combined-sequence active and reactive powers calculated for products between voltage phases A, B, C and current phases B, A, C respectively, while Table 2 is for combined-sequence active and reactive powers calculated for products between voltage phases A, B, C and current phases A, C, B respectively. Tables 1 and 2 illustrate that each type of unbalance is characterised by a specific combination of sign and magnitude for the DC component of combined-sequence active power and combined-sequence reactive power.

the sign of the combined-sequence active power, the sign of the combined-sequence reactive power and the relative magnitude of the combined-sequence active and reactive powers to known combinations of relative values. These known combinations of relative values may be stored in a memory of the third processing unit, for example a ROM. Each known combination may be associated with informa-

TABLE 1

| Unbalance in | DC component of active power ($P_{BAC}$) | DC component of reactive power ($Q_{BAC}$) |
|---|---|---|
| $V_A$ | $\frac{V_m I_m}{400}(\% \text{ unbalance})(\cos(\varphi) + \sqrt{3}\sin(\varphi))$ | $\frac{V_m I_m}{400}(\% \text{ unbalance})(3\cos(\varphi) - \sqrt{3}\sin(\varphi))$ |
| $V_B$ | $\frac{V_m I_m}{400}(\% \text{ unbalance})(\cos(\varphi) - \sqrt{3}\sin(\varphi))$ | $\frac{V_m I_m}{400}(\% \text{ unbalance})(-3\cos(\varphi) - \sqrt{3}\sin(\varphi))$ |
| $V_C$ | $\frac{-V_m I_m}{200}(\% \text{ unbalance})(\cos(\varphi))$ | $\frac{V_m I_m}{400}(\% \text{ unbalance})(\sqrt{3}\sin(\varphi))$ |
| $I_A$ | $\frac{V_m I_m}{400}(\% \text{ unbalance})(\cos(\varphi) - \sqrt{3}\sin(\varphi))$ | $\frac{V_m I_m}{400}(\% \text{ unbalance})(3\cos(\varphi) + \sqrt{3}\sin(\varphi))$ |
| $I_B$ | $\frac{V_m I_m}{400}(\% \text{ unbalance})(\cos(\varphi) + \sqrt{3}\sin(\varphi))$ | $\frac{V_m I_m}{400}(\% \text{ unbalance})(-3\cos(\varphi) + \sqrt{3}\sin(\varphi))$ |
| $I_C$ | $\frac{-V_m I_m}{200}(\% \text{ unbalance})(\cos(\varphi))$ | $\frac{V_m I_m}{400}(\% \text{ unbalance})(-\sqrt{3}\sin(\varphi))$ |

TABLE 2

| Unbalance in | DC component of active power ($P_{ACB}$) | DC component of reactive power ($Q_{ACB}$) |
|---|---|---|
| $V_A$ | $\frac{-V_m I_m}{200}(\% \text{ unbalance})(\cos(\varphi))$ | $\frac{V_m I_m}{400}(\% \text{ unbalance})(\sqrt{3}\sin(\varphi))$ |
| $V_B$ | $\frac{V_m I_m}{400}(\% \text{ unbalance})(\cos(\varphi) + \sqrt{3}\sin(\varphi))$ | $\frac{V_m I_m}{400}(\% \text{ unbalance})(3\cos(\varphi) - \sqrt{3}\sin(\varphi))$ |
| $V_C$ | $\frac{V_m I_m}{400}(\% \text{ unbalance})(\cos(\varphi) - \sqrt{3}\sin(\varphi))$ | $\frac{V_m I_m}{400}(\% \text{ unbalance})(-3\cos(\varphi) - \sqrt{3}\sin(\varphi))$ |
| $I_A$ | $\frac{-V_m I_m}{200}(\% \text{ unbalance})(\cos(\varphi))$ | $\frac{V_m I_m}{400}(\% \text{ unbalance})(-\sqrt{3}\sin(\varphi))$ |
| $I_B$ | $\frac{V_m I_m}{400}(\% \text{ unbalance})(\cos(\varphi) - \sqrt{3}\sin(\varphi))$ | $\frac{V_m I_m}{400}(\% \text{ unbalance})(3\cos(\varphi) + \sqrt{3}\sin(\varphi))$ |
| $I_C$ | $\frac{V_m I_m}{400}(\% \text{ unbalance})(\cos(\varphi) + \sqrt{3}\sin(\varphi))$ | $\frac{V_m I_m}{400}(\% \text{ unbalance})(-3\cos(\varphi) + \sqrt{3}\sin(\varphi))$ |

The third processing unit may determine the sign of the combined-sequence active power, the sign of the combined-sequence reactive power and the relative magnitude of the combined-sequence active power and the combined-sequence reactive power. The relative magnitude of the combined-sequence active power and the combined-sequence reactive power may simply indicate which of the two quantities has the greater magnitude or alternatively may be a ratio of the two quantities.

A combination of the sign of the combined-sequence active power, the sign of the combined-sequence reactive power and the relative magnitude of the combined-sequence active and reactive powers may be characteristic for one or more possible fault types. Identification of a possible fault type may be performed by comparing determined values of tion about a type of fault or unbalance in the multi-phase power system, such as whether the unbalance is in the voltage or current and which phase of the multi-phase power system in unbalanced. Whether the unbalance is in the voltage or current may indicate the existence of a specific type of fault. For example, in a multi-phase power system including coil windings, an unbalance in the current might indicate a fault in the coil winding (e.g. a short current in the stator winding of an induction machine). Thereby, the third processing unit may be used to identify the possible existence of a more specific fault.

A magnitude of the second harmonic component of the combined-sequence power greater than a predetermined threshold may also indicate the possible existence of a fault in the multi-phase power system. The third processing unit may compare the magnitude of the second harmonic component of the combined-sequence power to a predetermined threshold. If the magnitude is greater than the predetermined threshold the third processing unit identifies the possible existence of a fault.

The third processing unit may use machine learning algorithms to diagnose the type of unbalance. For example, over time, the system may learn to associate particular characteristics of the DC or second harmonic components of the combined-sequence powers with particular types of unbalance or more specific faults. Known machine learning algorithms can be used, such as an artificial neural network or fuzzy logic.

When the third processing unit receives more than one combined-sequence power calculated based on different sequences as input, the different combined-sequence powers may be used in a number of ways. For example, each different combined-sequence power may be compared to a respective threshold. If one or more of these exceed the threshold value, then the system may be determined as having a possible fault. Alternatively, the threshold value may need to be exceeded for all the different combined-sequence powers for the system to be determined as having a possible fault. Further, using one or more combined-sequence powers, may provide additional information about the type of fault and where the fault originates.

If the possible existence of a fault is identified by the third processing unit, the third processing unit may notify an operator of the system of the possible existence of a fault. The third processing unit may switch on an alarm or provide some form of alert, for example. Further, the third processing unit may communicate specific information about the possible fault to the operator (e.g. whether the fault may be the stator winding of an induction machine).

When the possible existence of a fault is identified, the system operator may physically inspect the system to identify the existence of a fault and intervene appropriately, for example by repairing or replacing the system.

It will be appreciated that one or more of the first processing unit, the second processing unit and the third processing unit may be implemented using a single microprocessor or a single computer as opposed to separate microprocessors or computers.

FIG. 1 shows an example system for assessing the condition of a three-phase power system in accordance with the present disclosure. In this example, a variable frequency drive provides electrical power to an induction machine.

A voltage and current acquiring unit includes voltage and current sensors for acquiring voltage and current signals from terminals between the variable frequency drive and the induction machine for each phase A, B and C. The acquired voltage and current signals for each of the three phases are also normalised by the voltage and current acquiring unit.

A microprocessor serves as a first processing unit for calculating the combined-sequence active and reactive powers.

A low pass filter serves as a second processing unit for extracting the DC components of the combined-sequence active power and combined-sequence reactive power, $P_{dc}$ and $Q_{dc}$.

The microprocessor also serves as a third processing unit for determining the condition of the multi-phase power system and notifying the condition of the multi-phase system to a machine operator.

Figure 2:
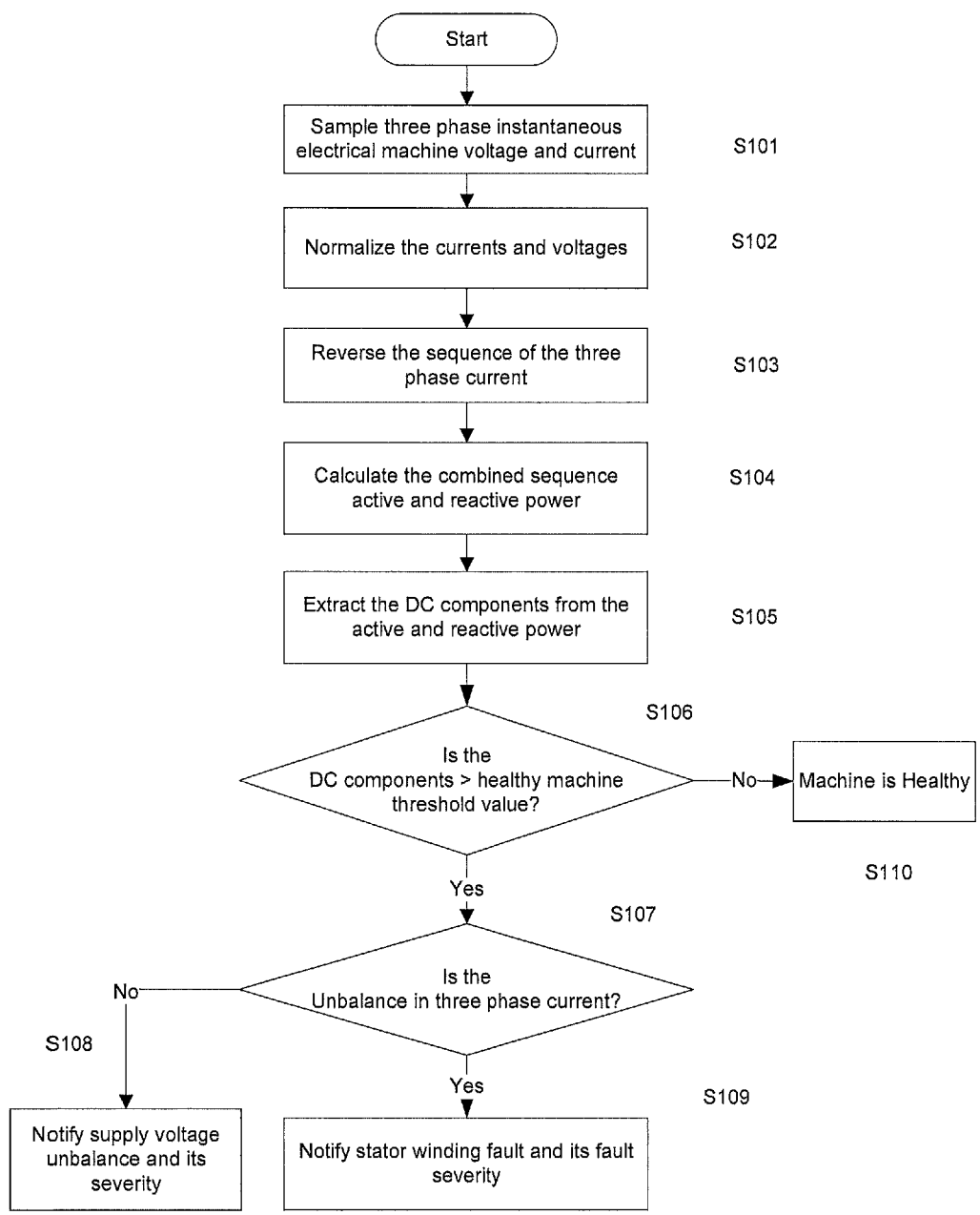
FIG. 2 shows a flow chart of a first method for assessing the condition of a three-phase power system.

FIG. 2 is a flow diagram showing the steps of a first example method in accordance with the present disclosure, for assessing the condition of a three-phase power system. In step S101, the voltages and currents are sampled to generate voltage and current signals. In step S102, the voltage and current signals are normalised. In step S103, current and voltage vectors are acquired and the sequence of phases of the current vector is reversed relative to the voltage vector. In step S104, the combined-sequence active and reactive powers are calculated. In step S105, the DC components are extracted from the combined-sequence active and reactive powers. In step S106, the DC components of the combined-sequence active and reactive power are compared to respective threshold values. If the DC components of the combined-sequence active and reactive powers are not greater that the respective threshold value, the machine is determined not to have a possible fault in step S110. If the DC component of the combined-sequence active or reactive power is greater that the respective threshold value, the machine is determined to have a possible fault and the process proceeds to step S107. In step S107, it is determined whether the unbalance in the system is in the current, based on the magnitudes and signs of the combined-sequence active and reactive powers. If it is determined that the unbalance is in the current, a stator winding fault and the fault severity are notified in step S108. If it is determined that the unbalance is not in the current (i.e. is in the voltage) a supply voltage unbalance and severity is notified in step S109.

Figure 3:
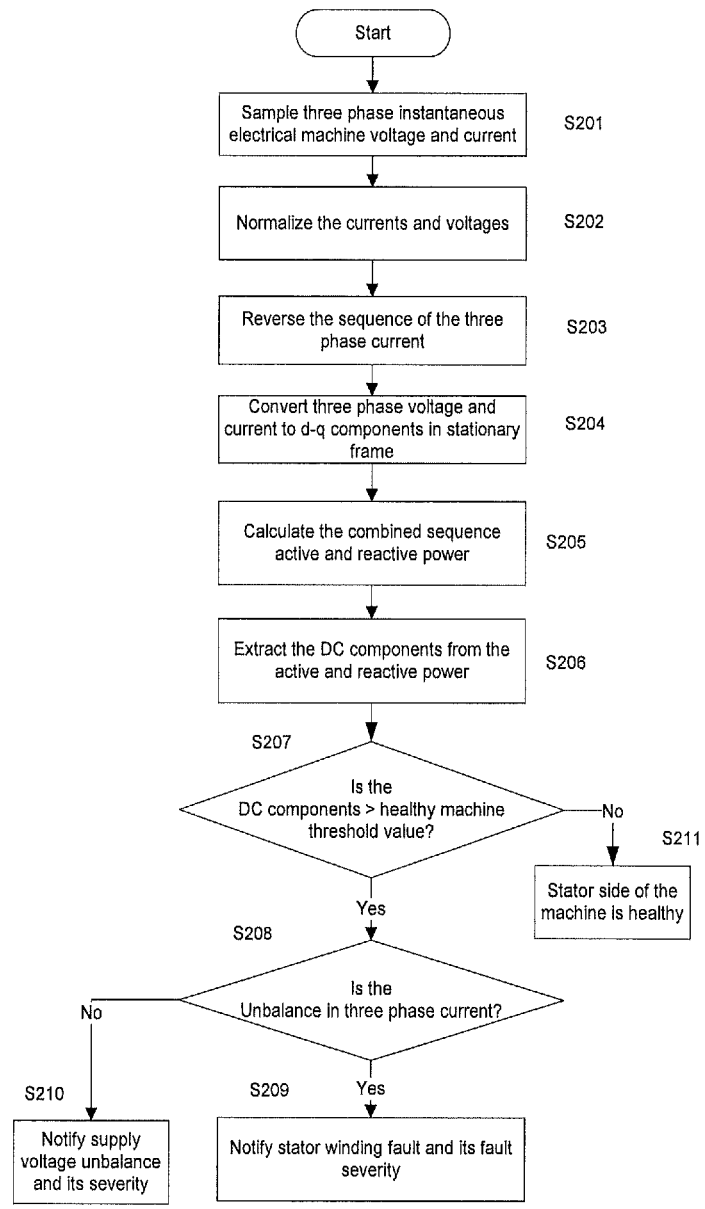
FIG. 3 shows a flow chart of a second method for assessing the condition of a three-phase power system.

FIG. 3 is a flow diagram showing the steps of a second example method in accordance with the present disclosure for assessing the condition of a three-phase power system (e.g. for assessing the condition of electrical equipment in the system). In step S201, the voltages and currents are sampled to generate current and voltage signals. In step S202, the voltage and current signals are normalised. In step S203, current and voltage vectors are acquired and the sequence of phases of the current vector is reversed relative to the voltage vector. In step S204, the voltage and current vectors with three components corresponding to the three phases are converted to voltage and current vectors with two components by applying a Park transformation. In step S205, the combined-sequence active and reactive powers are calculated. In step S206, the DC components are extracted from the combined-sequence active and reactive powers. In step S207, the DC components of the combined-sequence active and reactive powers are compared to respective threshold values. If the DC component of the combined-sequence active power and reactive power are not greater that the respective threshold value, the machine is determined not to have a possible fault in step S211. If the DC components of the combined-sequence active or reactive power is greater that the respective threshold value, the machine is determined to have a possible fault and the process proceeds to step S208. In step S208, it is determined whether the unbalance in the system is in the three-phase current based on the magnitudes and signs of the combined-sequence active and reactive powers. If it is determined that the unbalance is in the current, a stator winding fault (e.g. in an induction machine) and the fault severity are notified in step S209. If it is determined that the unbalance is not in the current (i.e. is in the voltage) a supply voltage unbalance (e.g. due to faults in the power supply) and severity is notified in step S210.

Figure 4:
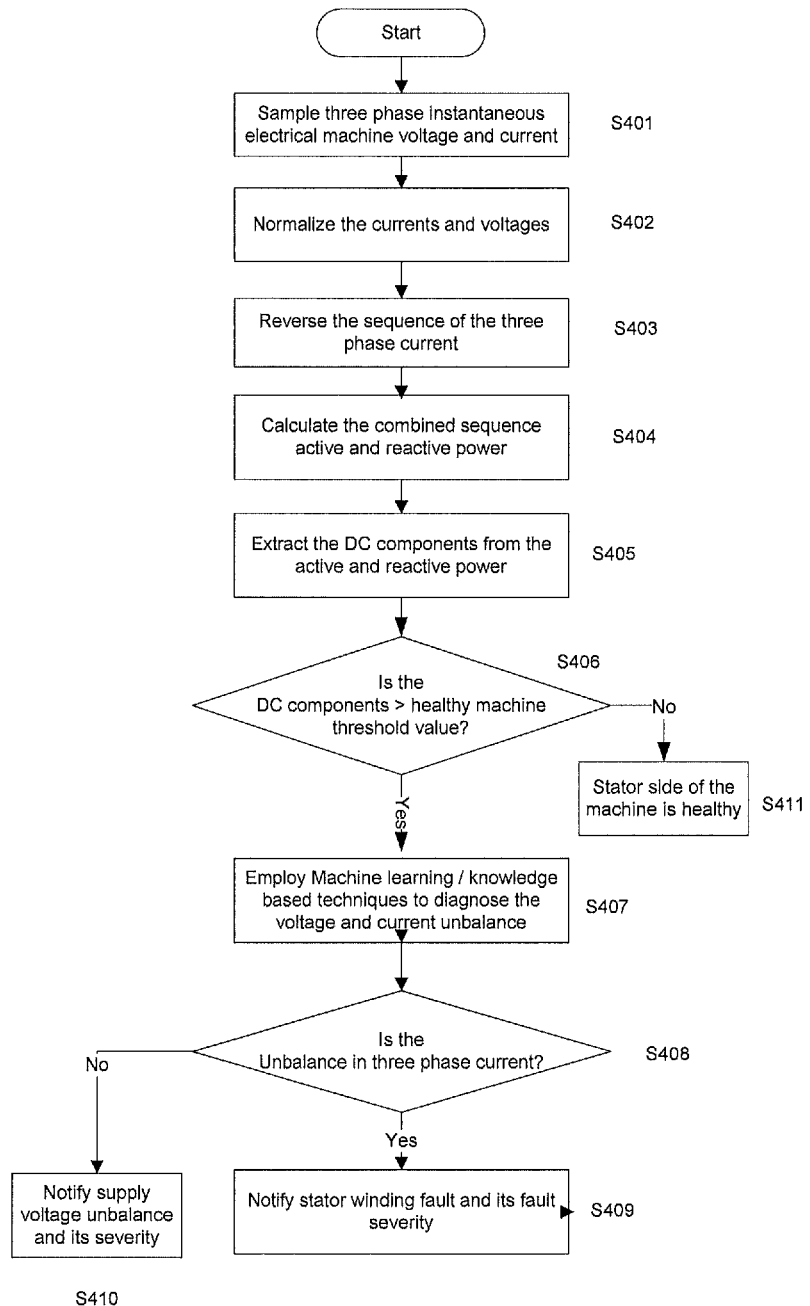
FIG. 4 shows a flow chart of a third method for assessing the condition of a three-phase power system.

FIG. 4 is a flow diagram showing the steps of a third example method in accordance with the present disclosure, for assessing the condition of a three-phase power system (e.g. for assessing the condition of electrical equipment in the system). In step S401, the voltages and currents are sampled to generate current and voltage signals. In step S402, the voltage and current signals are normalised. In step S403, current and voltage vectors are acquired and the sequence of phases of the current vector is reversed relative to the voltage vector. In step S404, the combined-sequence active and reactive powers are calculated. In step S405, the DC components are extracted from the combined-sequence active and reactive powers. In step S406, the DC components of the combined-sequence active and reactive powers are compared to a respective threshold value. If the DC components of the combined-sequence active and reactive powers are not greater that the respective threshold values, the machine is determined not to have a possible fault in step S411. If the DC component of the combined-sequence active or reactive power is greater that the respective threshold value, the machine is determined to be unbalanced and the process proceeds to step S407. In step S407, machine learning is applied to determine whether the unbalance is in voltage or current. In step S408, it is determined whether the unbalance in the system is in the three-phase current based on the magnitudes and signs of the combined-sequence active and reactive powers. If it is determined that the unbalance is in the current, a stator winding fault (e.g. in an induction machine) and the fault severity are notified in step S409. If it is determined that the unbalance is not in the current (i.e. is in the voltage) a supply voltage unbalance (e.g. due to faults in the power supply) and severity is notified in step S410.

Figure 5:
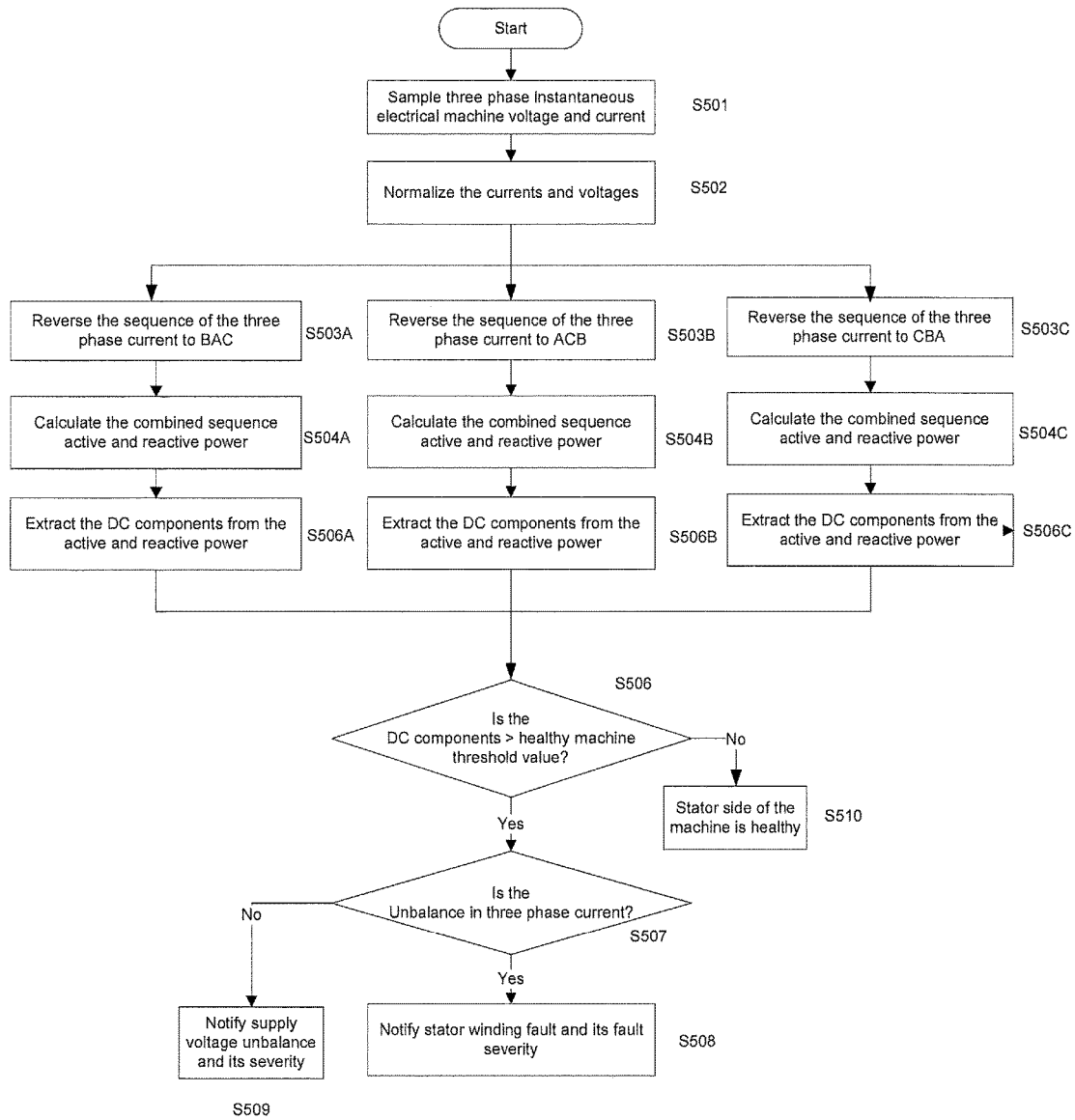
FIG. 5 shows a flow chart of a fourth method for assessing the condition of a three-phase power system.

FIG. 5 is a flow diagram showing the steps of a fourth example method in accordance with the present disclosure for assessing the condition of a three-phase power system (e.g. for assessing the condition of electrical equipment in the system). In step S501, the voltages and currents are sampled to generate current and voltage signals. In step S502, the voltage and current signals are normalised. In step S503A, current and voltage vectors are acquired and the sequence of phases of the current vector is reversed relative to the voltage vector from an ABC sequence to a BAC sequence. In step S504A, the combined-sequence active and reactive powers are calculated. In step S505A, the DC components are extracted from the combined-sequence active and reactive powers. In step S503B, current and voltage vectors are acquired and the sequence of phases of the current vector is reversed relative to the voltage vector from an ABC sequence to an ACB sequence. In step S504B, the combined-sequence active and reactive power is calculated. In step S505B, the DC components are extracted from the combined-sequence active and reactive powers. In step S503C, current and voltage vectors are acquired and the sequence of phases of the current vector is reversed relative to the voltage vector from an ABC sequence to a CBA sequence. In step S504C, the combined-sequence active and reactive powers are calculated. In step S505C, the DC components are extracted from the combined-sequence active and reactive powers. In step S506, the DC components of the combined-sequence active and reactive powers for the different sequences (BAC/ACB/CBA) are compared to respective threshold values. If the DC components of the combined-sequence active and reactive powers are not greater that the respective threshold value, the machine is determined not to have a possible fault in step S510. If the DC components of the combined-sequence active or reactive power are greater than the threshold value for one of the different sequences, the machine is determined to have a possible fault and the process proceeds to step S507. In step S507, it is determined whether the unbalance in the system is in the current, based on the magnitudes and signs of the combined-sequence active and reactive powers. If it is determined that the unbalance is in the current, a stator winding fault (e.g. in an induction machine) and the fault severity are notified in step S508. If it is determined that the unbalance is not in the three-phase current (i.e. is in the three-phase voltage) a supply voltage unbalance (e.g. due to faults in the power supply) and severity is notified in step S509.

Figure 6:
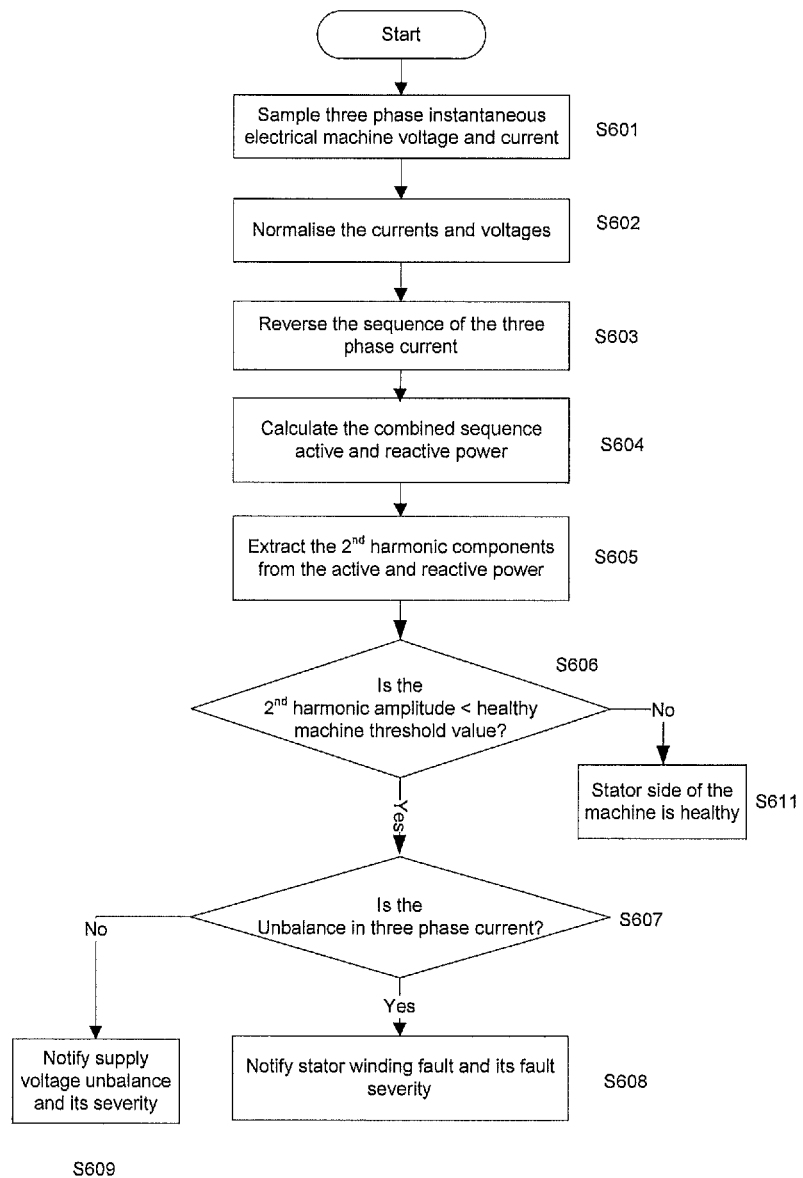
FIG. 6 shows a flow chart of a fifth method for assessing the condition of a three-phase power system.

FIG. 6 is a flow diagram showing the steps of a fifth example method in accordance with the present disclosure for assessing the condition of a three-phase power system (e.g. for assessing the condition of electrical equipment in the system). In step S601, the voltages and currents are sampled to generate current and voltage signals. In step S602, the voltage and current signals are normalised. In step S603, current and voltage vectors are acquired and the sequence of phases of the current vector is reversed relative to the voltage vector. In step S604, the combined-sequence active and reactive powers are calculated. In step S605, second harmonic components are extracted from the combined-sequence active and reactive powers. In step S606, the second harmonic amplitudes of the combined-sequence active power and reactive power are compared to respective threshold values. If the second harmonic amplitudes of the combined-sequence active and reactive powers are not greater that the respective threshold values, the machine is determined not to have a possible fault in step S611. If the second harmonic amplitude of the combined-sequence active or reactive power is greater that the respective threshold value, the machine is determined to have a possible fault and the process proceeds to step S607. In step S607, it is determined whether the unbalance in the system is in the current using machine learning techniques. If it is determined that the unbalance is in current, a stator winding fault (e.g. in an induction machine) and the fault severity are notified in step S608. If it is determined that the unbalance is not in the current (i.e. is in the voltage) a supply voltage unbalance (e.g. due to faults in the power supply) and severity is notified in step S609.

The present disclosure provides an improved method and system for assessing the condition of a multi-phase power system. In comparison to conventional methods and systems, the present disclosure requires lower computational resources, is simpler and easier to implement, is capable of incipient fault detection, and provides more accurate and robust fault diagnosis.

What is claimed is:

1. A method of assessing a condition of a multi-phase power system, the method comprising:
   acquiring, via a voltage sensor and a current sensor, a voltage signal and a current signal, respectively, for each phase of the multi-phase power system;
   calculating, via a processor, a product of the voltage signal for each phase of the multi-phase power system with a current signal for one of the phases of the multi-phase power system, wherein at least two of the calculated products are the product of the voltage signal for one phase and the current signal for a different phase;
   summing, via the processor, the calculated products;
   performing a frequency analysis of the summed calculated products to extract at least one of a direct current component of the summed calculated products and a second harmonic component of the summed calculated products;
   determining whether the extracted at least one of the direct current component of the summed calculated products and the second harmonic component of the summed calculated products exceeds a threshold; and when it is determined that the extracted at least one of the direct current component of the summed calculated products and the second harmonic component of the summed calculated products exceeds a threshold, identifying the possible existence of a fault in the multi-phase power system.

2. The method of claim 1, wherein the frequency analysis includes obtaining a direct current component of the summed calculated products.

3. The method of claim 1, wherein the frequency analysis includes obtaining the second harmonic component of the summed calculated products.

4. The method of claim 2, wherein it is identified that there is a possible fault in the multi-phase power system if at least one component exceeds a threshold.

5. The method of claim 1, wherein a reactive component of the summed calculated products is calculated by summing products of the voltage signals and current signals in which the phase difference between each pair of signals in the product is different from the phase difference between the signals in the originally acquired voltage and current signals by 90 degrees.

6. The method of claim 1, wherein an active component of the summed calculated products is calculated by summing products of the voltage signals and current signals in which the phase difference between each pair of signals in the product is the same as the phase difference between the signals in the originally acquired voltage and current signals.

7. The method of claim 6, wherein the frequency analysis is performed on both the active and reactive components of the summed calculated products.

8. The method of claim 7, wherein in identifying the possible existence of a fault in the multi-phase power system the sign and magnitude of the frequency analysed active component of the summed calculated products and the frequency analysed reactive component of the summed calculated products are analysed.

9. The method of claim 1, wherein:
the step of calculating the summed calculated products comprises:
obtaining a voltage vector by combining the voltage signals for each of the phases of the multi-phase power system in order;
obtaining a current vector by combining the current signals for each of the phases of the multi-phase power system but in a different order to the voltage vector such that the positions of current signals in the current vector for at least two phases are different from the positions of the voltage signals in the voltage vector for the same two phases;
linearly transforming the voltage and current vectors having a component for each phase of the multi-phase system to reduced voltage and current vectors having fewer components; and
calculating the product of the reduced voltage and current vectors.

10. The method of claim 9, wherein the stage of linear by transforming the voltage and current vectors uses a Park transformation.

11. The method of claim 1, further comprising:
calculating a second product of the voltage signal for each phase of the multi-phase power system with one of the current signals such that the product is between a voltage signal for one phase and a current signal for a different phase for at least a second two of the products, where the second two products are different to the previous two products;
summing the calculated second products; and
identifying the possible existence of a fault in the multi-phase power system based on a frequency analysis of the summed calculated products and the summed calculated second products.

12. The method of claim 1, further comprising
physically inspecting the multi-phase power system when a certain condition is determined.

13. A system for assessing a condition of a multi-phase power system, the system comprising:
a voltage sensor and a current sensor configured to acquire a voltage signal and a current signal for each phase of the multi-phase power system; and
at least one processor programmed to:
calculate a product of the voltage signal for each phase of the multi-phase power system with a current signal for one of the phases of the multi-phase power system, wherein at least two of the calculated products are the product of the voltage signal for one phase and the current signal for a different phase, and sum the calculated products;
perform a frequency analysis on the summed calculated products to extract at least one of a direct current component of the summed calculated products and a second harmonic component of the summed calculated products; and
determine whether the extracted at least one of the direct current component of the summed calculated products and the second harmonic component of the summed calculated products exceeds a threshold and, when it is determined that the extracted at least one of the direct current component of the summed calculated products and the second harmonic component of the summed calculated products exceeds a threshold, to identify the possible existence of a fault in the multi-phase power system.

14. The system of claim 13, wherein the at least one processor is configured to extract the direct current component of the summed calculated products.

15. The system of claim 14, wherein the at least one processor is a low-pass filter.

16. The system of claim 13, wherein the at least one processor is configured to extract the second harmonic component of the summed calculated products.

17. The system of claim 13 wherein the at least one processor is configured to identify that there is a possible fault in the multi-phase power system if at least one component exceeds a threshold.

18. The system of claim 13, wherein:
the at least one processor is configured to calculate a reactive component of the summed calculated products by summing products of the voltage signals and current signals in which the phase difference between each pair of signals in the product is different from the phase difference between the signals in the originally acquired voltage and current signals by 90 degrees.

19. The system of claim 13, wherein:
the at least one processor is configured to calculate an active component of the summed calculated products by summing products of the voltage signals and current signals in which the phase difference between each pair of signals in the product is the same as the phase difference between the signals in the originally acquired voltage and current signals.

20. The system of claim 19, wherein:
the at least one processor is configured to perform a frequency analysis on the active component and reactive component of the summed calculated products; and
the at least one processor is configured to identify the possible existence of a fault in the multi-phase power system based on the frequency analysis of the active component and reactive component of the summed calculated products.

21. The system of claim 20, wherein:
the at least one processor is configured to analyse the sign and magnitude of the frequency analysed active component of the summed calculated products and the sign and magnitude of the frequency analysed reactive component of the summed calculated products to identify the possible existence of a fault in the multi-phase power system.

22. The system of claim 13, wherein the at least one processor is configured to:
obtain a voltage vector by combining the voltage signals for each of the phases of the multi-phase power system in order;
obtain a current vector by combining the current signals for each of the phases of the multi-phase power system but in a different order to the voltage vector such that the positions of current signals in the current vector for at least two phases are different from the positions of the voltage signals in the voltage vector for the same two phases;
linearly transform the voltage and current vectors having a component for each phase of the multi-phase system to reduced voltage and current vectors having fewer components; and
calculate the product of the reduced voltage and current vectors.

23. The system of claim 13, wherein:
the at least one processor is further configured to calculate a second product of the voltage signal for each phase of the multi-phase power system with one of the current signals such that the product is between a voltage signal for one phase and a current signal for a different phase for at least a second two of the products, where the second two products are different to the previous two products, and sum the calculated second products; and
the at least one processor is further configured to identify the possible existence of a fault in the multi-phase power system based on a frequency analysis of the summed calculated products and the summed calculated second products.

24. A non-transitory computer-readable medium having instructions for assessing the condition of a multi-phase power system based on current and voltage signals acquired from a voltage sensor and a current sensor, when executed by a computer, the instructions cause the computer to perform the steps of:
calculating, via a processor, a product of the voltage signal for each phase of the multi-phase power system with a current signal for one of the phases of the multi-phase power system, wherein at least two of the calculated products are the product of the voltage signal for one phase and the current signal for a different phase;
summing, via the processor, the calculated products;
performing a frequency analysis of the summed calculated products to extract at least one of a direct current component of the summed calculated products and a second harmonic component of the summed calculated products;
determining whether the extracted at least one of the direct current component of the summed calculated products and the second harmonic component of the summed calculated products exceeds a threshold; and
when it is determined that the extracted at least one of the direct current component of the summed calculated products and the second harmonic component of the summed calculated products exceeds a threshold, identifying the possible existence of a fault in the multi-phase power system.

* * * * *